United States Patent
Kumar et al.

[11] Patent Number: 6,103,632
[45] Date of Patent: Aug. 15, 2000

[54] IN SITU ETCHING OF INORGANIC DIELECTRIC ANTI-REFLECTIVE COATING FROM A SUBSTRATE

[75] Inventors: Ajay Kumar, Sunnyvale; Jeffrey D. Chinn, Foster City, both of Calif.

[73] Assignee: Applied Material Inc., Santa Clara, Calif.

[21] Appl. No.: 08/955,771

[22] Filed: Oct. 22, 1997

[51] Int. Cl.[7] .................................................. H01L 21/302
[52] U.S. Cl. .......................... 438/717; 438/585; 438/592; 438/721; 438/723; 438/724; 438/736; 438/738
[58] Field of Search .................................. 438/585, 952, 438/717, 721, 723, 724, 736, 738

[56] References Cited

U.S. PATENT DOCUMENTS

| | | | |
|---|---|---|---|
| 4,490,209 | 12/1984 | Hartman . | |
| 5,094,712 | 3/1992 | Becker et al. | 156/643 |
| 5,320,975 | 6/1994 | Cederbaum et al. | 437/44 |
| 5,441,914 | 8/1995 | Taft et al. | 437/189 |
| 5,605,601 | 2/1997 | Kawasaki | 156/643.1 |
| 5,706,164 | 1/1998 | Jeng | 257/296 |

FOREIGN PATENT DOCUMENTS 5-299390  11/1993  Japan .

OTHER PUBLICATIONS

Integrated Deposition and Etching Approach to High Performance Dielectric Non-Reflective Coatings for Deep Ultraviolet Applications on $WSi_x$ and Polysilicon By: Madhu Deshpande, Judy Huang, Wai-Fan Yau, David Cheung, Ajay Kumar, and Jeff Chinn Semiconductor Fabtech, 6 ed., Jun. 1997, pp. 263–269.

Chemical Vapor Deposition of Anti-Reflective Layer Film for Excimer Laser Lithography By: Tetsuo Gocho, Tobru Ogawa, Masakazu Muroyame and Jun-ichi Sato SPIE vol. 1927 Optical/Laser Microlithography VI (1993).

Practical resolution enhancement effect by new complete anti-reflective layer in KrF excimer laser lithography By: Tohru Ogawa, Mitsunori Kimura, Tetsuo Gotyo, Yoichi Tomo, and Toshiro Tsumori SPIE vol. 1927 Optical/Laser Microlithography VI (1993), pp. 263–272.

$SiOxNy$:H, high Performance anti-reflective layer for the current and future optical lithography By: Tohru Ogawa, Hiroyuki Nakano, Tetsuo Gocho, Toshiro Tsumori SPIE vol. 2197 pp. 722–731.

Silicon Processing for The VLSI Era Volume 1: Process Technology By: Stanley Wolf Ph.D., Richard N. Tauber, Ph.D. Lattice Press, pp. 438–441.

*Primary Examiner*—William Powell
*Assistant Examiner*—George Goudreau
*Attorney, Agent, or Firm*—Michaelson and Wallace

[57] ABSTRACT

The present invention is embodied in a method and apparatus for etching dielectric layers and inorganic ARC's without the need for removing the substrate being processed from the processing chamber and without the need for intervening processing steps such as chamber cleaning operations (in situ process). A layer and/or a multi-layer film deposited on a substrate, such as silicon, is located within a processing chamber. The substrate has a base, an underlying layer above the base, an overlying layer above the underlying layer, and a top dielectric anti-reflective coating (DARC) layer formed on the overlying layer. In the preferred method, first, the DARC layer and the overlying layer is etched by a first process gas. Next, the underlying layer is etched by a second process gas.

16 Claims, 5 Drawing Sheets

IN SITU ETCHING OF INORGANIC DIELECTRIC ANTI-REFLECTIVE COATING FROM A SUBSTRATE

BACKGROUND OF THE INVENTION

1. Field of the Invention

The present invention relates in general to an apparatus for, and the processing of, semiconductor substrates. In particular, the invention relates to the in situ etching of dielectric anti-reflective coatings during substrate processing.

2. Related Art

The critical dimensions (CD's) and geometries of semiconductor devices have decreased dramatically in size since they were first introduced several decades ago. Although, currently, most semiconductor devices are fabricated with feature sizes of about 0.35 microns, it is desirable to produce semiconductor devices, for example, semiconductor integrated circuit chips, with smaller feature sizes, such as 0.25 microns and lower.

One important micro geometry of such semiconductor devices includes the formation of a patterned thin film on a base substrate of the device by chemical reaction of gases. When patterning the thin films, it is desirable that fluctuations in line width and other critical dimensions be minimized. Errors in these dimensions can result in variations in device characteristics or open-/short-circuited devices, thereby adversely affecting device yield. Thus, as feature sizes decrease, structures must be fabricated with greater accuracy. As a result, some manufacturers now require that variations in the dimensional accuracy of patterning operations be held to within 5% of the dimensions specified by the designer.

Some substrate processing systems employ photolithographic techniques to pattern layers. These techniques employ photoresist or other light-sensitive material deposited on a wafer. A photomask having transparent and opaque regions embodying the desired pattern is positioned over the photoresist. When the mask is exposed to light, the transparent portions allow exposure of the photoresist in the transparent regions, but not in the regions where the mask is opaque. The light causes a chemical reaction in the exposed portion s of the photoresist (e.g., photosolubilization or polymerization). A suitable chemical, chemical vapor or ion bombardment process is then used to selectively attack either the reacted or unreacted portions of the photoresist. With the remaining photoresist pattern acting as a mask, the underlying layer may then undergo further processing. For example, the layer may be doped or etched, or other processing can be performed.

Some photolithographic techniques often involve the use of equipment known as steppers, which are used to mask and expos e photoresist layers. Steppers often use monochromatic (single-wavelength) light, enabling them to produce the detailed patterns required in the fabrication of fine geometry devices. However, as a substrate is processed, the topology of the substrate's upper surface becomes progressively less planar. This uneven topology can cause reflection and refraction of the monochromatic light, resulting in exposure of some of the photoresist beneath the opaque portions of the mask. As a result, this uneven surface topology can alter the mask pattern transferred to the photoresist layer, thereby altering the desired dimensions of the structures subsequently fabricated.

One phenomenon resulting from these reflections is standing waves. When a photoresist layer is deposited on a reflective underlying layer and exposed to monochromatic radiation (e.g., deep ultraviolet (UV) light), standing waves may be produced within the photoresist layer. In such a situation, the reflected light interferes with the incident light and causes a periodic variation in light intensity within the photoresist layer in the vertical direction. Standing-wave effects are usually more pronounced at the deep UV wavelengths used in modern steppers than at longer wavelengths because surfaces of materials such as oxide, nitride, and polysilicon are more reflective at deep UV wavelengths. The existence of standing waves in the photoresist layer during exposure causes roughness in the vertical walls formed when sections of the photoresist layer are removed during patterning, which translates into variations in linewidths, spacing and other critical dimensions.

There are several techniques currently used to help reduce and/or eliminate the standing waves and problems associated with these waves, while achieving required critical dimensional accuracies. The use of an anti-reflective coating (ARC) is one such technique. Some types of ARCs which use absorption to control standing waves have optical characteristics such that reflections occurring at inter-layer interfaces are minimized. The ARC's absorptive index is such that the amount of monochromatic light transmitted (in either direction) is minimized, thus attenuating both transmitted incident light and reflections thereof. The ARC's refractive and absorptive indices are fixed at values that cause any reflections which might still occur to be canceled.

Another type of ARC is a dielectric ARC (DARC). Dielectric ARC's produce extraordinary smooth and conformal topography to allow uniform phase shift over topographies. As a result, reflected light is canceled by phase shift cancellation. As such, dielectric anti-reflective coatings, which use phase shift cancellation of the standing waves, is superior to other types ARCs, which use absorption of the standing waves. This is because DARC's reduce and/or eliminate problems associated with the standing waves more effectively than conventional ARCs. Further, DARCs produce excellent optical properties.

However, portions of the DARC must be etched during fabrication of the device, which is currently a challenge. Etching comprises introducing a selected process gas into an etching chamber and producing a plasma from the process gas. The plasma selectively etches the substrate and creates volatile etch byproduct compounds which are removed from the etching chamber. The reactivity of deposited materials with respect to the etchants used in etching a given layer is important in achieving accurate transfer of the mask pattern.

A material's reactivity with respect to another material with regard to a given etchant is known as the material's etch selectivity. Etch selectivity is usually denoted by a ratio of the etch rate of the material to be removed to that of the other material. A high etch selectivity is therefore often desirable because, ideally, an etchant should selectively etch only the intended areas of the layer being etched and not erode other structures which may already exist on the substrate being processed. In other words, a material with high etch selectivity substantially resists unintended etching during the intended etching of another material.

For example, high etch selectivity of a first layer with respect to a second overlying layer is desirable when different patterns are to be etched into the first and second layers. High etch selectivity is desirable in such situations because the underlying layer will not be significantly eroded in areas where the second layer is completely etched away if the first layer's etch selectivity is low. The etching operation removes not only the intended regions of the second layer, but also portions of the first layer underlying those regions. While a small amount of the first layer is normally removed in such situations, extremely low etch selectivity may permit substantial etching of the first layer.

However, currently, typical etch selectivities for DARCs are very low. Thus, typical reactive ion etching processes used to selectively etch thin film patterning layers of a device do not work well with DARCs due to the poor etch selectivities. As a result, currently, DARCs do not produce results that they are potentially capable of producing. In addition, currently, etching of DARCs are not performed in situ (same chamber without intervening processing steps, such as cleanings, etc.), which cause inefficiencies and reduces throughput. Consequently, DARCs are not commercially viable because the etching of a DARC is expensive, time consuming, and inefficient. Hence, the results produced by DARCs are not worth the time and costs incurred.

Therefore, what is needed is a dielectric ARC etching system that provides high etch selectivity. What is also needed is a system that allows for in situ etching of dielectric layers and ARC's during substrate processing. What is also needed is a system that avoids unwanted etching of layers underlying the layer being patterned. What is also needed is a system for creating such a layer using a minimal number of processing steps. What is additionally needed is a process to perform accurate etching of an ARC layer.

Whatever the merits of the above mentioned systems and methods, they do not achieve the benefits of the present invention.

SUMMARY OF THE INVENTION

To overcome the limitations in the prior art described above, and to overcome other limitations that will become apparent upon reading and understanding the present specification, the present invention is embodied in a method and apparatus for etching dielectric layers and inorganic ARCs without the need for removing the substrate being processed from the processing chamber and without the need for intervening processing steps such as chamber cleaning operations. This process is thus referred to herein as an in situ process.

The present invention is embodied in a process for etching a layer and/or a multi-layer film deposited on a substrate, such as silicon, located within a processing chamber. The substrate has a base, an underlying layer above the base, an overlying layer above the underlying layer, and a top DARC layer formed on the overlying layer.

In the preferred embodiment, first, the DARC layer and the overlying layer, such as a silicide $WSi_x$, is etched by a first process gas. Next, the underlying layer, such as a polysilicon layer, is etched by a second process gas. These steps are performed as an in situ process.

In another embodiment, first, the DARC layer is etched by a first process gas. Second, the overlying layer, such as a silicide ($WSi_x$), is etched by a second process gas. Next, the underlying layer, such as a polysilicon layer, is etched by a third process gas. These steps are also performed as an in situ process.

Throughout both processes, the substrate remains in the processing chamber. As such, the present invention eliminates the need to remove the substrate from the processing chamber between etching of the different layers, for chamber cleanings and the like. This improves throughput, reduces downtime and reduces contamination, among other benefits. In addition, the in situ processes of the present invention allows accurate control over the etch rate of the layers.

A feature of the present invention is the ability to etch a dielectric ARC with high etch selectivity. Another feature of the present invention is the capability of in situ etching of dielectric layers and inorganic ARC's. An advantage of present invention is that accurate etching of the DARC layer is produced. Another advantage of present invention is that the substrate being processed does not need to be removed from the processing chamber. Yet another advantage of present invention is that unwanted etching of layers underlying the layer being patterned is avoided. Another advantage of the present invention is that it can be used for all work related to etching, such as metal and silicon etching.

The foregoing and still further features and advantages of the present invention as well as a more complete understanding thereof will be made apparent from a study of the following detailed description of the invention in connection with the accompanying drawings and appended claims.

BRIEF DESCRIPTION OF THE DRAWINGS

Referring now to the drawings in which like reference numbers represent corresponding parts throughout.

DETAILED DESCRIPTION OF THE PREFERRED EMBODIMENT

In the following description of the preferred embodiment, reference is made to the accompanying drawings which form a part hereof, and in which is shown by way of illustration a specific embodiment in which the invention may be practiced. It is to be understood that other embodiments may be utilized and structural changes may be made without departing from the scope of the present invention.

I. Introduction

The present invention is embodied in a system and method for etching in situ (without having to remove the substrate from the processing chamber in which it is situated) a substrate, such as silicon, in a plasma reactor chamber. The substrate has a dielectric anti-reflective coating (DARC) containing, for example, silicon, oxygen and nitrogen.

The DARC layer can be deposited on the substrate by commercially available techniques and methods, such as using a plasma-enhanced chemical vapor deposition (PECVD) method.

II. Components

Figure 1:
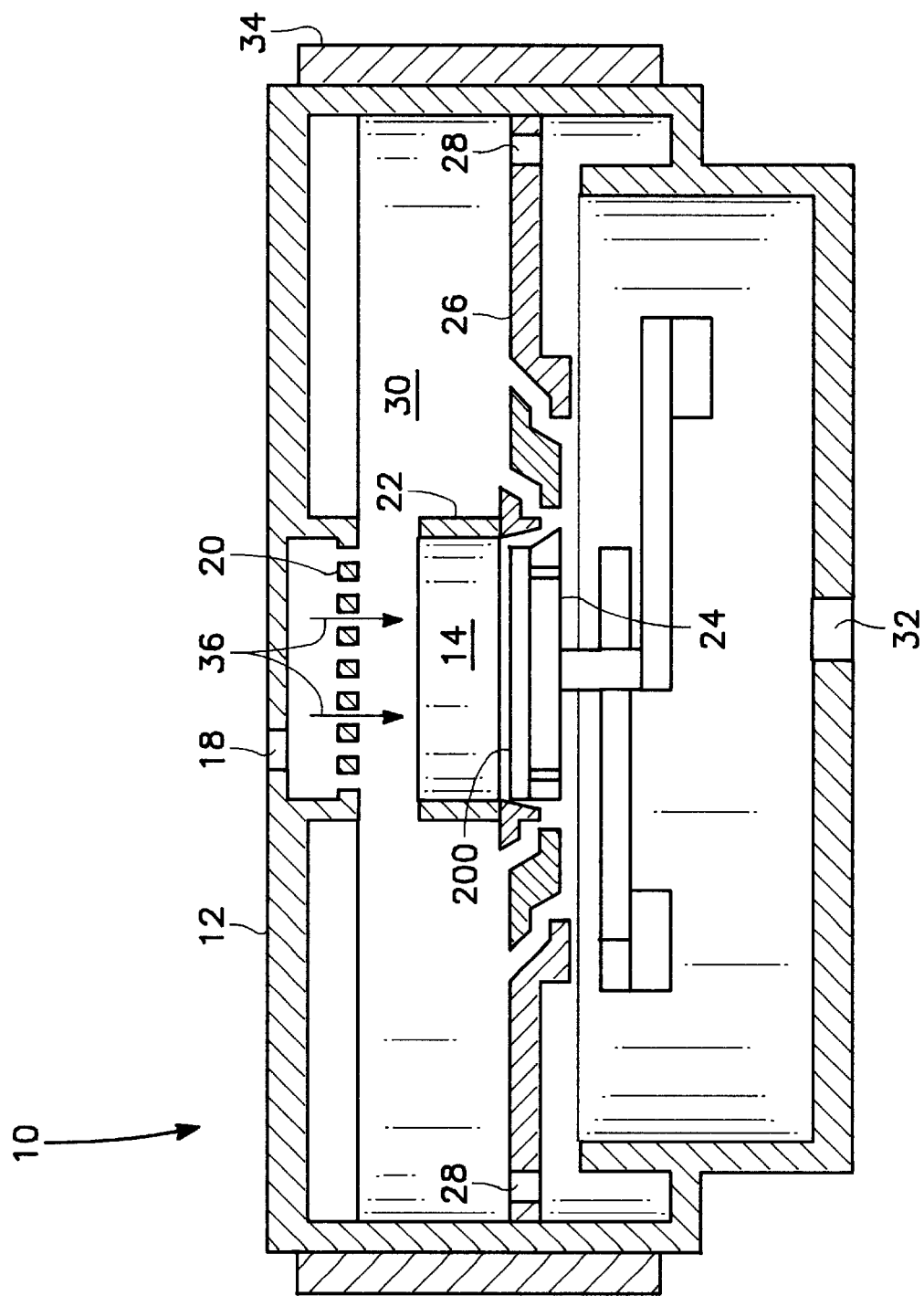
FIG. 1 is a vertical cross-section of an apparatus suitable for practicing the processes of the present invention.

FIG. 1 is a vertical cross-section of an apparatus suitable for practicing the processes of the present invention. A reaction device 10 suitable for practicing the present invention comprises an etching chamber 12 having an etch zone 14. For typical etching (the specific etching process of the present invention will be discussed below), process gas is introduced into the etching chamber 12 through the gas inlet 18.

The process gas then passes through a "showerhead" diffuser plate 20 which distributes the process gas in the etching zone 14. A surrounding focus ring 22 substantially maintains the generated plasma in the etching zone 14. In operation, a substrate 200, is placed on the cathode 24 and a process gas (depending on the layer/layers to be etched) is introduced through the gas inlet 18 into the etching chamber 12. A plasma is generated from the process gas to selectively etch the layers of the substrate 200.

A barrier or pumping plate 26 has a plurality of exhaust holes 28 therethrough. The plate 26 separates the etching chamber 12 into two zones, namely, the etching zone 14 and a non-etching zone 30. The exhaust holes 28 are in fluid communication with a vacuum pump (not shown) via an exhaust port 32 for exhausting spent process gas and volatile etch byproducts from the etching chamber 12.

The reaction device 10 can be magnetically enhanced. A magnetic coil 34 can be provided around the etching chamber 12 to magnetically enhance the plasma formed from the process gas in the etching zone 14. A plasma of the process gas is generated in the etch zone 14. The flow of the plasma is represented by the arrows 36.

Figure 2:
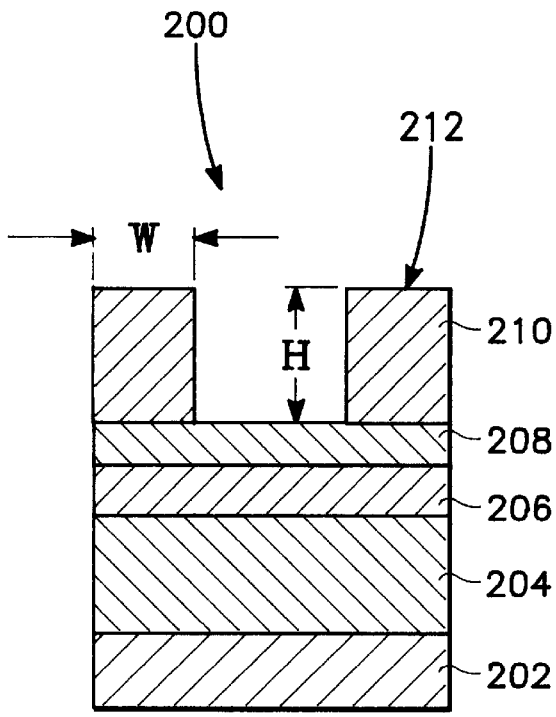
FIG. 2 is a vertical cross-section of a substrate of the present invention with a dielectric anti-reflective coating.

FIG. 2 is a vertical cross-section of a substrate of the present invention with a dielectric anti-reflective coating. The substrate 200 has a base 202, an underlying layer 204 above the base, an overlying layer 206 above the underlying layer 204, and a top DARC layer 208 formed on the overlying layer 206. Typically, the underlying layer 204 is to be patterned.

The base 202 is typically comprised of silicon, the underlying layer 204 can be comprised of doped or undoped polysilicon, the overlying layer 206 can be a silicide, such as a tungsten-silicide ($WSi_x$) or a dielectric material such as $SiO_2$, $Si_3N_4$, $Si_xN_y$, SiON, $Si_xO_yN_z$, or the like, and the DARC layer 208 can be comprised of $SiO_xN_y$:H, or the like.

The DARC layer 208 is applied to reduce reflective notching, standing waves, back scattered light, and over etching by phase shift cancellation. Also, the DARC maximizes photoresist exposure latitude and optimizes photoresist sidewall profiles during the photolithographic process. The DARC layer 208 typically has a thickness of about 300 Å.

A photoresist pattern 210 is formed on the DARC layer 208 during the photolithographic process. The photoresist pattern 210 is substantially resistant to etching so that the portions of the substrate 200 covered by the photoresist pattern 210 are substantially not etched during the etching of the substrate 200.

The photoresist pattern 210 can comprise upstanding features 212 typically having a width, W, of less than about 0.5 µm and a height, H, of less than about 1.0 µm. The features 212 form a profile angle, α, which is typically from about 85° to about 87° relative to the upper surface plane of the DARC layer 208.

III. In Situ Processes of the Present Invention

Figure 3A:
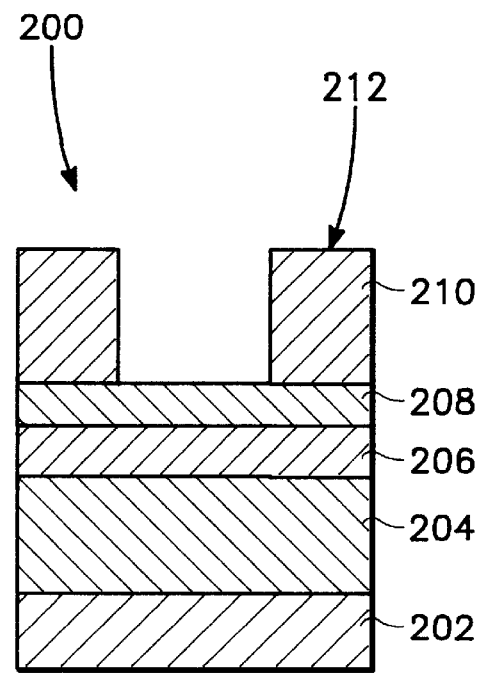
FIG. 3A is a vertical cross-section of a substrate to be etched in accordance with the preferred embodiment of the present invention.
Figure 3B:
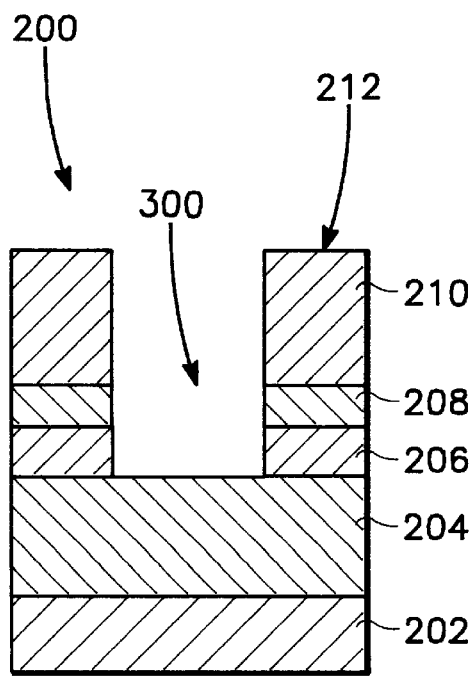
FIG. 3B is a vertical cross-section of the substrate of FIG. 3A being etched by the first step in accordance with the preferred embodiment of the present invention.
Figure 3C:
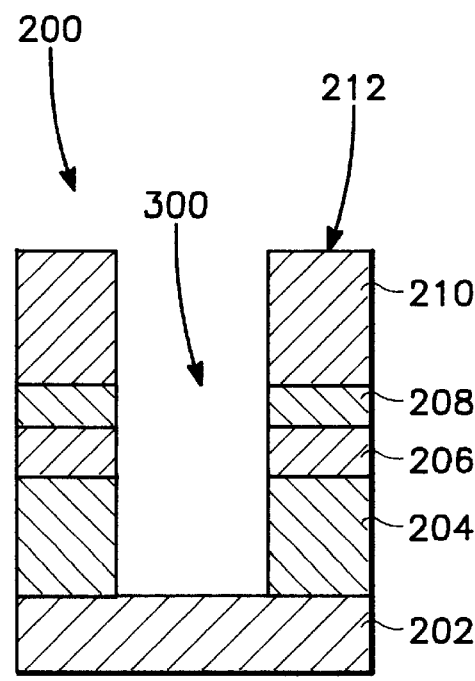
FIG. 3C is a vertical cross-section of the substrate of FIG. 3A being etched by the second step in accordance with the preferred embodiment of the present invention.

Referring to FIG. 1, along with the FIGS. 3A, 3B, and 3C, FIG. 3A is a vertical cross-section of a substrate to be etched in accordance with the preferred embodiment of the present invention. The substrate 200 of FIG. 3A to be etched can be similar to the composition of the substrate 200 of FIG. 2. It should be noted that many different substrate compositions with a DARC layer can be etched with the system and methods of the present invention and the substrate shown in the Figures is merely for illustrative purposes only.

FIG. 3B is a vertical cross-section of the substrate of FIG. 3A being etched by the first step in accordance with the preferred embodiment of the present invention. First, the substrate 200 is located in the reaction device 10. A first process gas then passes through the diffuser plate 20 which distributes the first process gas in the etching zone 14 and a plasma is generated. The generated plasma is maintained in the etching zone 14 by the surrounding focus ring 22. The generated plasma of the first process gas selectively etches the DARC layer 208 and the overlying layer 206 within a designated area 300 defined by the photoresist 212.

The first process gas and at least one passivating compound can be selected from the group consisting of compounds containing N, F, such as $F_3$, and compounds containing Cl, such as $Cl_2$, and mixtures thereof. The preferred complete composition of the first process gas is $NF_3+Cl_2$.

FIG. 3C is a vertical cross-section of the substrate of FIG. 3A being etched by the second step in accordance with the preferred embodiment of the present invention. In the second etch step, a second process gas passes through the diffuser plate 20 which distributes the second process gas in the etching zone 14 and a plasma is generated. The generated plasma is maintained in the etching zone 14 by the surrounding focus ring 22. The generated plasma of the second process gas selectively etches the underlying layer 204 within a designated area 300 defined by the photoresist 212.

The second process gas and at least one passivating compound can be selected from the group consisting of compounds containing H and Br, compounds containing H and Cl, such as $Cl_2$, and mixtures thereof. The preferred complete composition of the second process gas is $HBr+Cl_2$.

Referring to FIG. 1, along with the FIGS. 4A, 4B, 4C, and 4D, FIG. 4A is a vertical cross-section of a substrate to be etched in accordance with another embodiment of the present invention. The substrate 200 of FIG. 4A to be etched can be similar to the composition of the substrate 200 of FIG. 2. It should be noted that many different substrate compositions with a DARC layer can be etched with the system and methods of the present invention and the substrate shown in the Figures is merely for illustrative purposes only.

Figure 4A:
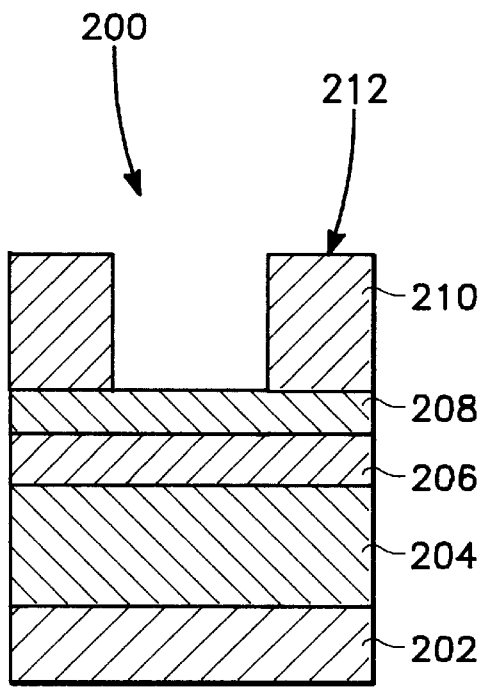
FIG. 4A is a vertical cross-section of a substrate to be etched in accordance with another embodiment of the present invention.
Figure 4B:
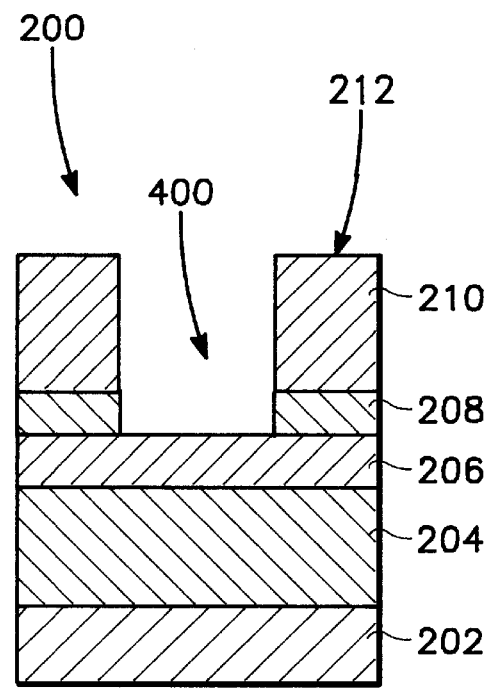
FIG. 4B is a vertical cross-section of the substrate of FIG. 4A being etched by the first step in accordance with another embodiment of the present invention.

FIG. 4B is a vertical cross-section of the substrate of FIG. 4A being etched by the first step in accordance with the preferred embodiment of the present invention. First, the substrate 200 is located in the reaction device 10. A first process gas then passes through the diffuser plate 20 which distributes the first process gas in the etching zone 14 and a plasma is generated. The generated plasma is maintained in the etching zone 14 by the surrounding focus ring 22. The generated plasma of the first process gas selectively etches the DARC layer 208 within a designated area 400 defined by the photoresist 212.

The first process gas and at least one passivating compound can be selected from the group consisting of compounds containing C, F, such as $F_4$, and compounds containing He and O, such as $O_2$, and mixtures thereof. The preferred complete composition of the first process gas is $CF_4+He:O_2$.

Figure 4C:
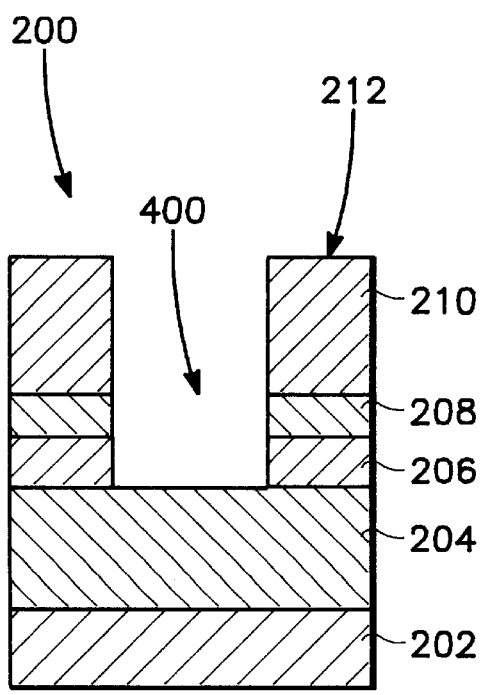
FIG. 4C is a vertical cross-section of the substrate of FIG. 4A being etched by the second step in accordance with another embodiment of the present invention.

FIG. 4C is a vertical cross-section of the substrate of FIG. 4A being etched by the second step in accordance with another embodiment of the present invention. In the second etch step, a second process gas passes through the diffuser plate 20 which distributes the second process gas in the etching zone 14 and a plasma is generated. The generated plasma is maintained in the etching zone 14 by the surrounding focus ring 22.

The generated plasma of the second process gas selectively etches the overlying layer 206 within a designated area 400 defined by the photoresist 212.

The second process gas and at least one passivating compound can be selected from the group consisting of compounds containing S, F, such as $F_6$, and compounds containing H and Br, and mixtures thereof. The preferred complete composition of the second process gas is $SF_6+HBr$.

Figure 4D:
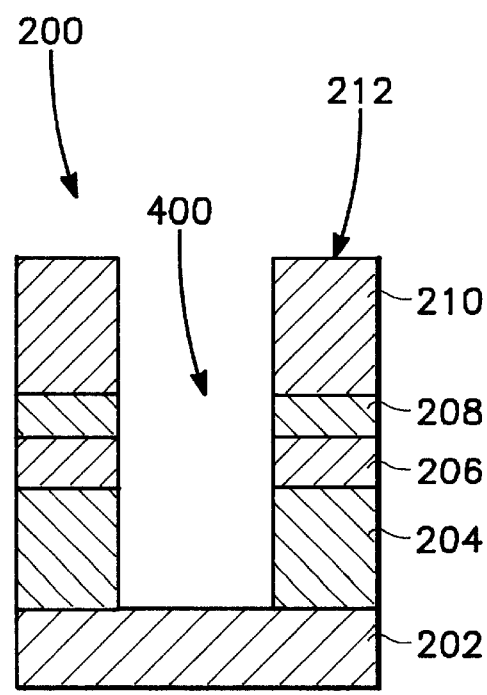
FIG. 4D is a vertical cross-section of the substrate of FIG. 4A being etched by the third step in accordance with another embodiment of the present invention.

FIG. 4D is a vertical cross-section of the substrate of FIG. 4A being etched by the third step in accordance with the preferred embodiment of the present invention. In the third etch step, a third process gas passes through the diffuser plate 20 which distributes the second process gas in the etching zone 14 and a plasma is generated. The generated plasma is maintained in the etching zone 14 by the surrounding focus ring 22. The generated plasma of the third process gas selectively etches the underlying layer 204 within a designated area 400 defined by the photoresist 212.

The third process gas and at least one passivating compound can be selected from the group consisting of compounds containing H and Br and compounds containing H and Cl, such as $Cl_2$, and mixtures thereof. The preferred complete composition of the second process gas is $HBr+Cl_2$.

Various dilutent gases, such as He, other inert gases and CO, can also be added to each of the process gases.

The composition of the process gases can be varied by adjusting the molar ratios of the compounds. For example, a typical molar ratio of HBr to the $Cl_2$ in the Cl-containing gas is about 2:1. The molar ratio of HBr to $Cl_2$ in the Cl-containing gas can be from about 2:1 to about 5:1. Other molar ratios may be used for different process gas compositions. A typical flow rate of the process gases is about 200 sccm/min.

The process gas preferably comprises an effective amount of the passivating compound to produce sidewall passivation on the newly exposed etched coating sidewall surface, so as to achieve substantially anisotropic etching of the organic anti-reflective coating.

Throughout the foregoing in situ processes, the substrate 200 remains in the processing chamber 12. As such, the need to remove the substrate 200 from the processing chamber 12 between etching of different layers, for chamber 12 cleanings and the like, is eliminated. Hence, throughput is improved while downtime and contamination, are reduced, among other benefits. In addition, the in situ processes of the present invention allows accurate control over the etch rate of the layers.

IV. Reaction Device Settings

The plasma of each respective process gas or mixture of gasses is generated for etching respective selected layers. The power used to generate the plasma of each respective process gas is generally from about 100 watts to about 1000 watts, and is typically about 200 watts for a silicon wafer size of 200 mm.

The plasma of each respective process gas can optionally be enhanced by a method such as electron cyclotron resonance, magnetically enhanced reactors and inductively coupled plasma. Preferably, a magnetically enhanced ion reactor is used. The magnetic field in the reaction device 10 induced by the magnetic coil 34 must be sufficiently strong to increase the density of the ions formed in the plasma, but below a level that causes charge-up damage. The magnetic field on the surface of the substrate 200 is preferably from about 10 gauss to about 80 gauss, and is more preferably about 40 gauss.

The pressure in the etching chamber 12 is preferably maintained at from about 15 mTorr to about 200 mTorr, and more preferably at from about 15 mTorr to about 20 mTorr. Lower pressures provide more uniform etching, but lower etch rates.

The cathode 24 is maintained at a suitable temperature to prevent volatilization of the passivating deposit that forms during etching. The cathode 24 temperature is preferably from about −15° C. to about 60° C., and more preferably from about 0° C. to about 50° C.

V. Etch Results

Figure 5:
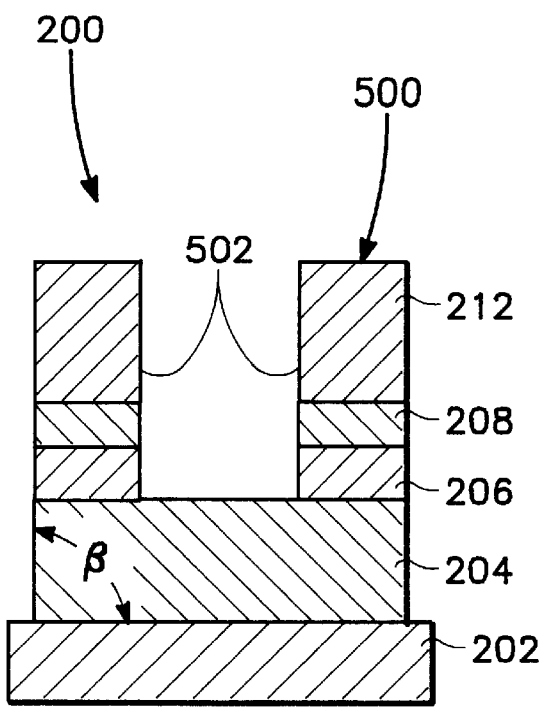
FIG. 5 is a vertical cross-section of a substrate in situ etched in accordance with the present invention.

FIG. 5 is a vertical cross-section of a substrate in situ etched in accordance with the present invention. Protected portions of the processed substrate 200 and DARC layer 208 form features 500. The features 500 comprise side walls 502 having a trench profile angle β relative to the substrate 200. This profile angle is preferably at least about 85°, and more preferably from about 85° to about 90°.

The processes according to the present invention eliminates microloading and minimizes the loss of critical dimensions of the features 40 to enhance subsequent etching performance of the substrate 200. The most important critical dimension is the width of the features, W, which ideally should be identical to the width of the photoresist.

The process according to the invention achieves an etch rate of the DARC layer 208 preferably greater than about 700 Å/min, and more preferably greater than about 800 Å/min. Also, the process gases of the present invention preferably produces a selectivity of the DARC layer 200 to the photoresist pattern of at least about 3 (3:1). Typical resist loss with the etch processes of the present invention is significantly lower than resist loss for conventional organic ARC etch processes. For example etch resist loss with the etch processes of the present invention is approximately 120 Å, as opposed to 1400 Å for conventional organic ARC etch processes.

VI. Working Examples

Figure 6:
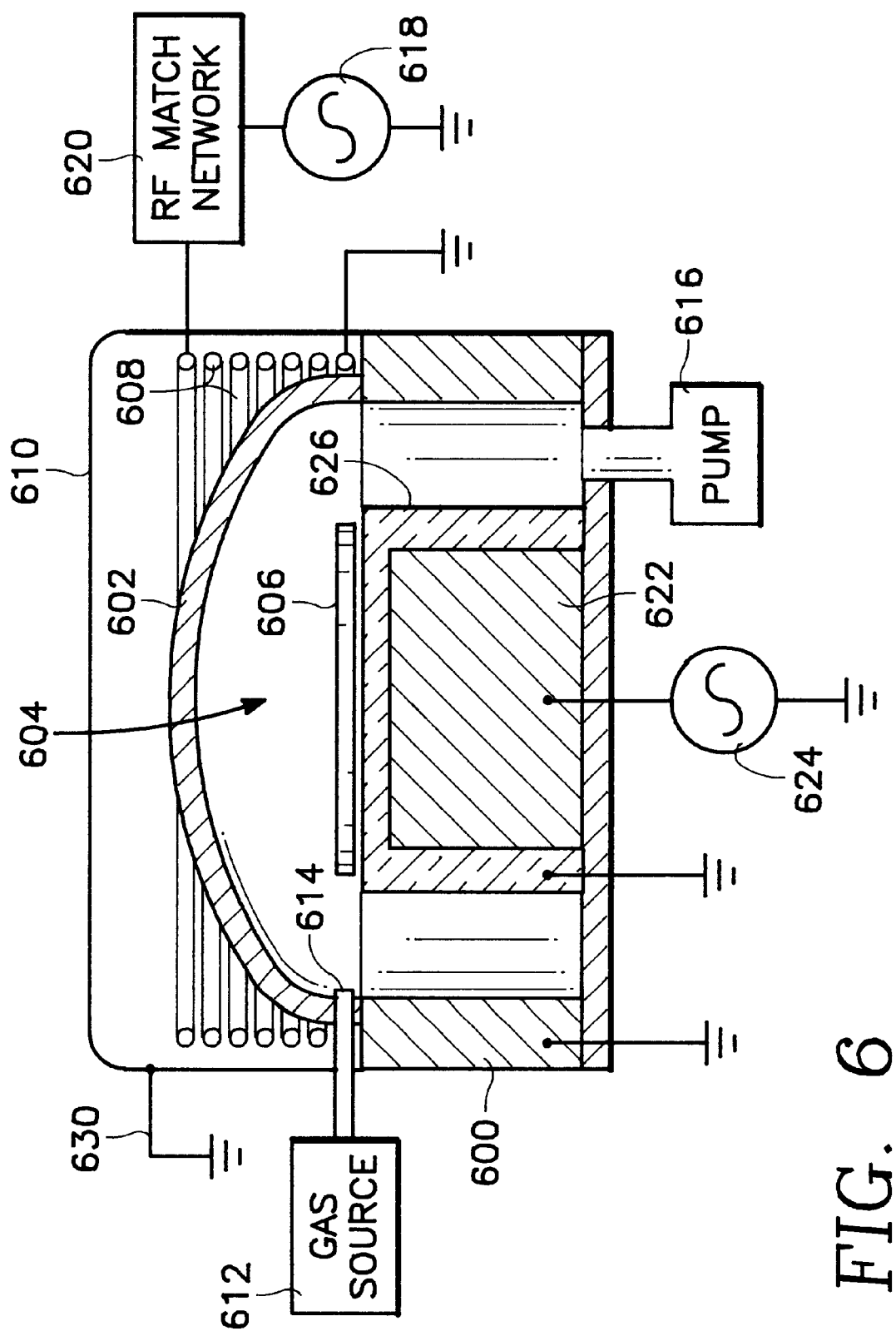
FIG. 6 is a vertical cross-section of another apparatus suitable for practicing the processes of the present invention.

FIG. 6 is a vertical cross-section of another apparatus suitable for practicing the processes of the present invention, and in particular the following working examples. An inductively coupled RF plasma reactor includes a reactor chamber having a grounded conductive cylindrical sidewall 600 and a dielectric ceiling 602, the reactor including a wafer pedestal 604 for supporting a semiconductor wafer 606 in the center of the chamber, a cylindrical inductor coil 608 surrounding an upper portion of the chamber beginning near the plane of the top of the wafer or wafer pedestal 604 and extending upwardly therefrom toward the top 610 of the chamber, a processing gas source 612 and gas inlet 614 for furnishing a processing gas into the chamber interior and a pump 616 for controlling the chamber pressure. The coil inductor 608 is energized by a plasma source power supply or RF generator 618 through a conventional active RF match network 620, the top winding of the coil inductor 608 being "hot" and the bottom winding being grounded. The wafer pedestal 604 includes an interior conductive portion 622 connected to a bias RF power supply or generator 624 and an exterior grounded conductor 36 (insulated from the interior conductive portion 622 ). A conductive grounded RF shield 630 surrounds the coil inductor 608.

The following examples (Working Examples 1, 2 and 3) demonstrate the efficacy of the present invention. The examples were conducted using a polysilicon decoupled plasma source (Poly DPS) chamber mounted on a Centura platform, available from Applied Materials Inc., Santa Clara, Calif. It should be noted that a $M_xP$ magnetically enhanced reactive ion reactor and, in particular, a "Precision 5000" system also available from Applied Materials Inc., Santa Clara, Calif., having an 8 in. MxP poly chamber could also be used.

Figure 7:
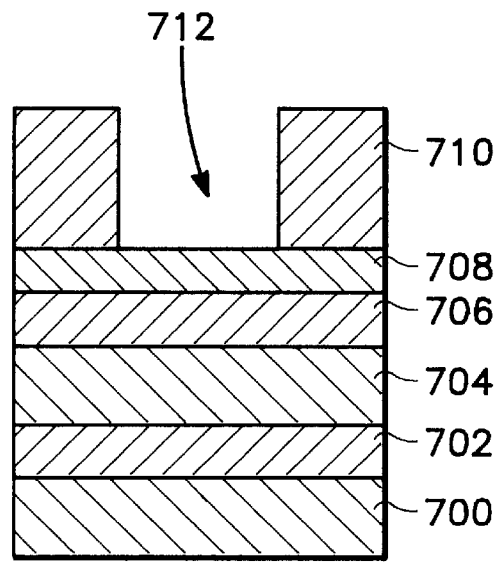
FIG. 7 is a schematic view in vertical cross-section of a working example of an in situ poly undoped gate etch of a substrate having a dielectric anti-reflective coating in accordance with the present invention.

FIG. 7 is a schematic view in vertical cross-section of Working example 1 of an in situ poly undoped gate etch of a substrate having a dielectric anti-reflective coating in accordance with the present invention. The wafer in Working example 1 was a silicon wafer 700 having a diameter of 200 mm (8 in.), with a 300 Å $G_{ox}$ underlying layer 702, a 2000 Å undoped polysilicon layer 704, a 300 Å SiON dielectric layer 706, and a 100 Å TEOS cap oxide layer 708. A photoresist pattern 710 was formed on the TEOS cap oxide layer 708. The photoresist pattern was preferably a DUV resist with a thickness (or feature height) of about 1.0 μm. The feature width was nominally about 0.5 μm and the width area 712 defined by the photoresist pattern 710 was about 0.5 μm.

Figure 8:
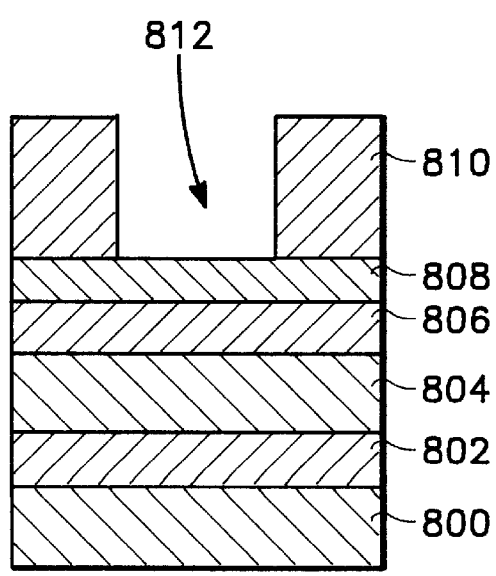
FIG. 8 is a schematic view in vertical cross-section of a working example of an in situ poly gate etch of a substrate having a dielectric anti-reflective coating in accordance with the present invention.

FIG. 8 is a schematic view in vertical cross-section of Working example 2 of an in situ poly gate etch of a substrate having a dielectric anti-reflective coating in accordance with the present invention. The wafer in Working example 2 was a silicon wafer 800 having a diameter of 200 mm (8 in.), with a 80 Å $G_{ox}$ underlying layer 802, a 2500 Å doped polysilicon layer 804, a 300 Å SiON dielectric layer 806, and a 100 Å TEOS cap oxide layer 808. A photoresist pattern 810 was formed on the TEOS cap oxide layer 808. The photoresist pattern was preferably a DUV resist with a thickness (or feature height) of about 1.0 μm. The feature width was nominally about 0.5 μm and the width area 812 defined by the photoresist pattern 810 was about 1.2 μm.

Figure 9:
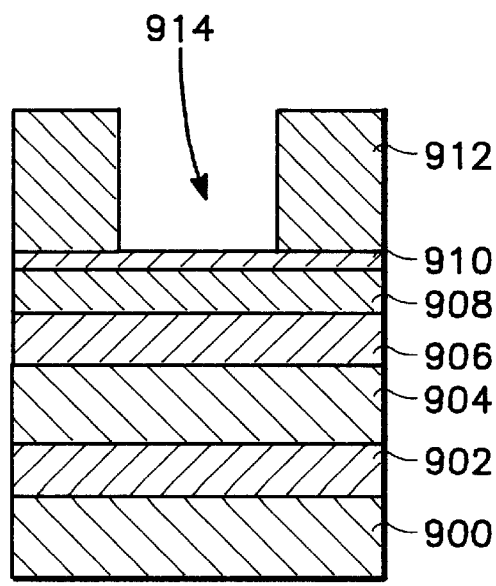
FIG. 9 is a schematic view in vertical cross-section of a working example of an in situ polycide gate etch of a substrate having a dielectric anti-reflective coating in accordance with the present invention.

FIG. 9 is a schematic view in vertical cross-section of Working example 3 of an in situ polycide gate etch of a substrate having a dielectric anti-reflective coating in accordance with the present invention. The wafer in Working example 3 was a silicon wafer 900 having a diameter of 200 mm (8 in.), with a 90 Å $G_{ox}$ underlying layer 902, a 1500 Å doped polysilicon layer 904, a 1000 Å tungsten silicide layer (WSi$_x$) 906, a 300 Å SiON dielectric layer 908, and a 100 Å TEOS cap oxide layer 910. A photoresist pattern 912 was formed on the TEOS cap oxide layer 910. The photoresist pattern was preferably a DUV resist with a thickness (or feature height) of about 1.0 μm. The feature width was nominally about 0.35 μm and the width area 914 defined by the photoresist pattern 912 was about 0.4 μm.

Working Example Recipes:

Working Example 1 (Poly Gate Etch—Undoped):

DARC Open: 75CF$_4$/5He—O$_2$/4mT/250Ws/25Wb/Endpoint+20%/50° C.

Poly ME: 30Cl$_2$/120HBr/13He—O$_2$/5mT/475Ws/75Wb/EP

Poly OE: 160HBr/10He—O$_2$/50mT/750Ws/100Wb/30s

RESULTS: Vertical Poly profile, no microloading $G_{ox}$ loss=<20 Å (post-dip)

Working Example 2 (Poly Gate Etch—Doped):

DARC Open: 75CF$_4$/5He—O$_2$/4mT/250Ws/25Wb/Endpoint+20%/50° C.

Poly ME: 60Cl$_2$/120HBr/10He—O$_2$/6mT/600Ws/100Wb/EP

Poly OE: 160HBr/10He—O$_2$/50mT/750Ws/100Wb/30s

RESULTS: Vertical Poly profile, no microloading

Remaining $G_{ox}$=82 Å (Pre), 66 Å (post-dip)

Working Example 3 (Poly Gate Etch—Silicide on top of Poly):

DARC Open: 75CF$_4$/5He—O$_2$/4mT/250Ws/25Wb/Endpoint+20%/50° C.

WSix: 130Cl$_2$/5He—O$_2$/8mT/600Ws/130Wb/EP+30%

Poly ME: 30Cl$_2$/120HBr/10He—O$_2$/8mT/600Ws/100Wb/Endpoint

Poly OE: 160HBr/10He—O$_2$/50mT/750Ws/100Wb/30s

RESULTS: Good profiles, very little microloading

Remaining $G_{ox}$=92 Å (Pre), 76 Å (post-dip)

The process conditions used for all three working examples are set forth TABLE I below. The etch selectivities are set forth in TABLE II below, and some results are set forth in TABLE III below. It should be noted that the working examples are given for illustrative purpose only.

TABLE I

PROCESS CONDITIONS*

| | DARC Etch | | | Main Etch | | Ex.3 | Over Etch | | |
|---|---|---|---|---|---|---|---|---|---|
| | Ex.1 | Ex.2 | Ex.3 | Ex.1 | Ex.2 | (WSi$_x$/Poly) | Ex.1 | Ex.2 | Ex.3 |
| Time(sec) | 32 | 33 | 33 | 60 | 57 | 32/52 | 30 | 30 | 30 |
| Power(Watts) | 250 | 250 | 250 | 475 | 600 | 600/600 | 750 | 750 | 750 |
| Bias(W) | 25 | 25 | 25 | 75 | 100 | 130/100 | 100 | 100 | 100 |
| CF$_4$ Etch gas(sccm) | 75 | 75 | 75 | — | — | — | — | — | — |
| Hbr Gases(sccm) | — | — | — | 120 | 120 | 0/120 | 160 | 160 | 160 |
| Cl$_2$ Gases (sccm) | — | — | — | 30 | 60 | 130/30 | — | — | — |
| Cathode Temperature(°C.) | 50 | 50 | 50 | 50 | 50 | 50 | 50 | 50 | 50 |
| HeO$_2$(sccm) | 5 | 5 | 5 | 13 | 10 | 5/10 | 10 | 10 | 10 |
| Pressure(mT) | 4 | 4 | 4 | 4 | 4 | 5/4 | 50 | 50 | 50 |

*Photoresist Profile Angle ≈ 87–88°

TABLE II

ETCH SELECTIVITIES

| | Etch Rate of DARC | Etch Selectivity of DARC to polysilicon/WSi$_x$ | Resist:DARC |
|---|---|---|---|
| Working Example 1 | 780 Å/min | 1:3 | 1:3 |
| Working Example 2 | 780 Å/min | 1:3 | 1:3 |
| Working Example 3 | 780 Å/min | 1:3.5/1:3 | 1:3 |

TABLE III

RESULTS

| | Dense | | | Iso | | |
|---|---|---|---|---|---|---|
| | Working Ex. 1 | Working Ex. 2 | Working Ex. 2 | Working Ex. 1 | Working Ex. 2 | Working Ex. 3 |
| Critical Dimension | bias = .012 μm | bias = .009 μm | bias = .003 μm | bias = −.011 μm | bias = −.002 μm | bias = −.007 μm |
| Profile Angle | 87–88° | 87–88° | 87–88° | 87–88° | 87–88° | 87–88° |
| Shoulder Loss | NONE | NONE | NONE | NONE | NONE | NONE |
| Photoresist Type | DUV | DUV | DUV | DUV | DUV | DUV |
| Gate Oxide | Good Integrity | Good | Good | Good | Good | Good |

*Endpoint detection was used for termination of the main etch at a wavelength of 312.5 nm.

The results of the above working examples demonstrate that a process according to the invention provides a high degree of anisotropic etching, substantially no undercutting or notching, a high selectivity of the DARC layer to polysilicon, and very low critical dimension loss.

The foregoing description of the preferred embodiment of the invention has been presented for the purposes of illustration and description. It is not intended to be exhaustive or to limit the invention to the precise form disclosed. Many modifications and variations are possible in light of the above teaching. It is intended that the scope of the invention be limited not by this detailed description, but rather by the claims appended hereto.

What is claimed is:

1. A process for etching a multi-layer film of a substrate disposed within a processing chamber, said process comprising the steps of:
   (a) introducing a first set of process gases into an etching zone of said chamber for a first period of time sufficient to etch a first layer of said substrate, said first set of process gases comprising a gas from the group consisting of helium-containing gas and oxygen-containing gas, wherein said first set of process gases is comprised of a CF4+He:O2 gas composition, said first layer of said substrate comprising a dielectric antireflective material;
   (b) introducing a second set of process gases into said etching zone of said chamber for a second period of time sufficient to etch a second layer of said substrate, said second layer comprising silicide; and
   (c) introducing a third set of process gases into said etching zone of said chamber for a third period of time sufficient to etch a third layer of said substrate, said third layer comprising polysilicon.

2. A process for etching a multi-layer film of a substrate disposed within a processing chamber, said process comprising the steps of:
   (a) introducing a first set of process gases into an etching zone of said chamber for a first period of time sufficient to etch a first layer of said substrate, said first set of process gases comprising a gas from the group consisting of helium-containing gas and oxygen-containing gas, said first layer of said substrate comprising a dielectric antireflective material;
   (b) introducing a second set of process gases into said etching zone of said chamber for a second period of time sufficient to etch a second layer of said substrate, wherein said second process gases comprise a gas compound selected from the group consisting of compounds containing both S and F and a gas compound selected from the group consisting of compounds containing both H and Br, said second layer comprising silicide; and
   (c) introducing a third set of process gases into said etching zone of said chamber for a third period of time sufficient to etch a third layer of said substrate, said third layer comprising polysilicon.

3. The invention as set forth in claim 2, wherein said third process gases is comprised of a SF$_6$+HBr gas composition.

4. A process for etching a multi-layer film of a substrate disposed within a processing chamber, said process comprising the steps of:
   (a) introducing a first set of process gases into an etching zone of said chamber for a first period of time sufficient to etch a first layer of said substrate, said first set of process gases comprising a gas from the group consisting of helium-containing gas and oxygen-containing gas, said first layer of said substrate comprising a dielectric antireflective material;
   (b) introducing a second set of process gases into said etching zone of said chamber for a second period of time sufficient to etch a second layer of said substrate, said second layer comprising silicide; and
   (c) introducing a third set of process gases into said etching zone of said chamber for a third period of time sufficient to etch a third layer of said substrate, wherein said third process gases comprise a chlorine-containing gas and a gas compound selected from the group consisting of compounds containing both H and Br, said third layer comprising polysilicon.

5. The invention as set forth in claim 4, wherein said third process gases is comprised of a HBr+Cl$_2$ gas composition.

6. A process for etching a multi-layer film of a substrate disposed within a processing chamber, said process comprising the steps of:
   (a) introducing a first set of process gases into an etching zone of said chamber for a first period of time sufficient to each a first layer of said substrate, said first set of process gases comprising a gas from the group of consisting of helium-containing gas and oxygen-containing gas, said first layer of said substrate comprising a dielectric antireflective material, wherein said substrate further comprises a top overlying layer, wherein said first process gases cause said first layer to possess a high etch selectivity ratio with respect to said top overlying layer, wherein overetching off said top overlying layer is prevented, wherein said etch selectivity ratio of said first layer to said top overlying layer is on the order of 3:1, wherein said first period of time is sufficient to etch a thickness on the order of 300 Å of said first layer and a thickness on the order of 100 Å of said top overlying layer;

(b) Introducing a second set of process gases into said etching zone of said chamber for a second period of time sufficient to etch a second layer of said substrate, said second layer comprising silicide; and (c) introducing a third set of process gases into said etching zone of said chamber for a third period of time sufficient to etch a third layer of said substrate, said third layer comprising polysilicon.

7. A method for processing a substrate having a photoresist pattern deposited thereon, said method comprising the steps of:

(a) placing into a chamber said substrate, wherein said substrate being a silicon-containing substrate having a multi-layer film deposited thereon, said multi-layer film comprising an inorganic dielectric antireflective material, an intermediate layer and an underlying layer;

(b) introducing into said chamber a first process gas comprising $NF_3+Cl_2$;

(c) generating a plasma of the first process gas in said chamber to etch through portions of the dielectric antireflective material and through portions of the intermediate layer not covered by the photoresist pattern;

(d) introducing into said chamber a second gas comprising $HBr+Cl_2$; and (e) generating a plasma of the second process gas in said chamber to etch portions of the underlying layer not covered by the photoresist pattern.

8. The invention as set forth in claim 7, wherein said silicide is tungsten silicide.

9. The invention as set forth in claim 7, wherein steps (a) and (e) are performed in situ and without intervening processing steps.

10. The invention as set forth in claim 7, wherein said first process gas causes said dielectric antireflective layer to possess a high etch selectivity ratio with respect to said photoresist pattern, wherein overetching of said photoresist pattern is prevented.

11. The invention as set forth in claim 10, wherein said etch selectivity ratio of said dielectric antireflective layer to said photoresist pattern is on the order of 3:1.

12. A method for processing a substrate having a photoresist pattern deposited thereon, said method comprising the steps of:

(a) placing into a chamber said substrate, wherein said substrate being a silicon-containing substrate having a multi-layer film deposited thereon, said multi-layer film comprising an inorganic dielectric antireflective material, an intermediate layer and an underlying layer;

(b) introducing into said chamber a first process gas comprising $CF_4+He:O_2$;

(c) generating a plasma of the first process gas in said chamber to etch the dielectric antireflective material not covered by the photoresist pattern;

(d) introducing into said chamber a second process gas comprising a SF_hd 6+HBr;

(e) generating a plasma of the second process gas in said chamber to etch the intermediate layer not covered by the photoresist pattern;

(f) introducing into said chamber a third process gas comprising $HBr+Cl_2$;

(g) generating a plasma of the third process gas in said chamber to etch the underlying layer not covered by the photoresist pattern.

13. The invention as set forth in claim 12, wherein said silicide is tungsten silicide.

14. The invention as set forth in claim 12, wherein steps (a) and (g) are performed in situ and without intervening processing steps.

15. The invention as set forth in claim 12, wherein said first process gas causes said dielectric antireflective layer to possess a high etch selectivity ratio with respect to said photoresist pattern, wherein overetching of said photoresist pattern is prevented.

16. The invention as set forth in claim 15, wherein said etch selectivity ratio of said dielectric antireflective layer to said photoresist pattern is on the order of 3:1.

* * * * *